(12) United States Patent
Novotny

(10) Patent No.: US 6,847,907 B1
(45) Date of Patent: Jan. 25, 2005

(54) DEFECT DETECTION AND REPAIR OF MICRO-ELECTRO-MECHANICAL SYSTEMS (MEMS) DEVICES

(75) Inventor: Vlad J. Novotny, Los Gatos, CA (US)

(73) Assignee: Active Optical Networks, Inc., Fremont, CA (US)

( * ) Notice: Subject to any disclaimer, the term of this patent is extended or adjusted under 35 U.S.C. 154(b) by 122 days.

(21) Appl. No.: 10/335,352

(22) Filed: Dec. 31, 2002

(51) Int. Cl.[7] .......................... G06F 19/00; G01R 31/26
(52) U.S. Cl. .......................................... 702/84; 438/17
(58) Field of Search ............................. 702/84; 73/1.41, 73/1.45; 438/17, 16; 382/145; 250/341.1

(56) References Cited

U.S. PATENT DOCUMENTS 6,496,351 B2   12/2002   Hill et al.

OTHER PUBLICATIONS

Pfeifer et al., Quality Control and Process Observation for the Micro Assembly Process, 2001, Elsevier, Measurement 30, pp. 1–18.*

Burns et al., A System for Automatic Electrical and Optical Characterization of Microelectromechanical Devices, Dec. 1999, Journal of Microelectromechanical Systems, vol. 8, No. 4, pp. 473–482.*

Rogers et al., Process Yields for Laser Repair of Aged, stiction–Failed, MEMS Devices, Jun. 2001, Journal of Microelectromechanical Systems, vol. 10, No. 2, pp. 280–285.*

Dias et al., Assembly Analytical Forum Analytical Tool Roadmap White Paper, Jun. 25, 2004, International SEMATECH.*

* cited by examiner

Primary Examiner—John Barlow
Assistant Examiner—Toan M. Le

(57) ABSTRACT

A method of defect detection and repair of micro-electro-mechanical systems (MEMS) devices comprising the steps of (A) detecting at least one defect in the MEMS device, wherein each defect is an object that prevents the MEMS device from functioning substantially properly; (B) performing repair of each detected defect; (C) checking whether the MEMS device is functioning substantially properly after each detected defect is repaired; and (D) if the MEMS device is not functioning substantially properly after each detected defect is repaired, repeating steps (A–C).

13 Claims, 10 Drawing Sheets

DEFECT DETECTION AND REPAIR OF MICRO-ELECTRO-MECHANICAL SYSTEMS (MEMS) DEVICES

BACKGROUND OF THE INVENTION

1. Field of the Invention

The present invention relates to the field of micro-electro-mechanical systems (MEMS) devices, and more specifically, to the field of detection and repair of defects that substantially prevent MEMS devices from functioning properly.

2. Discussion of the Prior Art

Micro engineered devices such as micro-electro-mechanical structures (MEMS) are presently being developed for a wide variety of applications in view of the size, cost and reliability advantages provided by these devices. For example, one advantageous MEMS device is a variable capacitor in which the interelectrode spacing between a pair of electrodes is controllably varied in order to selectively vary the capacitance between the electrodes. Typically, a conventional MEMS variable capacitor includes a pair of electrodes, one of which is disposed upon and fixed to the substrate and the other of which is typically carried on a movable actuator or driver. In accordance with MEMS technology, the movable actuator is preferably formed by micromachining the substrate such that very small and very precisely defined actuators can be constructed.

In general, performance of MEMS devices is adversely affected by the presence of various defects, including mechanical defects as well as electrical defects. Indeed, a typical movable actuator or sensor formed by micromachining the substrate is highly sensitive to the presence of different defects on its surface, as well in its volume, including mechanical and 'short' and/or 'open' electrical defects.

What is needed is to provide a method to efficiently detect and repair all mechanical as well as electrical defects that substantially prevent MEMS devices from functioning properly.

SUMMARY OF THE INVENTION

To address the shortcomings of the available art, the present invention provides for a method to efficiently detect and repair mechanical as well as electrical defects in a MEMS device.

One aspect of the present invention is directed to method of defect detection and repair of micro-electro-mechanical systems (MEMS) devices.

In one embodiment, the method of the present invention comprises the following steps: (A) detecting at least one defect in the MEMS device, wherein each defect is an object that prevents the MEMS device from functioning substantially properly; (B) performing repair of each detected defect; (C) checking whether the MEMS device is functioning substantially properly after each detected defect is repaired; and (D) if the MEMS device is not functioning substantially properly after each defect is repaired, repeating the steps (A–C).

In one embodiment of the present invention, the step (A) of detecting at least one defect in the MEMS device further includes the step of (A1) finding at least one defect generating a substantially large detection signal; and the step (B) of performing repair of each detected defect further includes the step of (B1) performing repair of each defect generating the substantially large detection signal.

In one embodiment of the present invention, the step (A) of detecting at least one defect in the MEMS device further includes the step (A1) of capturing each defect in the human or computer-generated field of view that generates a substantially large detection signal.

In one embodiment of the present invention, the step (A) of performing detection of each defect further includes the step (A1) of performing 3-D mapping of a non-uniform distribution of the local temperature inside the MEMS device. More specifically, in one embodiment of the present invention, the step (A1) of performing 3-D mapping of the non-uniform distribution of the local temperature inside the MEMS device further includes the step of applying excitation to the MEMS device. In another embodiment of the present invention, the step (A1) of performing 3-D mapping of the non-uniform distribution of the local temperature inside the MEMS device further includes the step of applying electromagnetic energy to the MEMS device. In one more embodiment of the present invention, the step (A1) of performing 3-D mapping of the non-uniform distribution of the local temperature inside the MEMS device further includes the step of applying electrical energy to the MEMS device at a constant current level, at a constant power level, or at a constant voltage level.

In one embodiment of the present invention, the step (A) of performing detection of each defect further includes the step (A2) of performing 2-D mapping of a non-uniform distribution of the local temperature on the surface of the MEMS device. More specifically, in one embodiment of the present invention, the step (A1) of performing 2-D mapping of the non-uniform distribution of the local temperature inside the MEMS device further includes the step of applying excitation to the MEMS device. In another embodiment of the present invention, the step (A1) of performing 2-D mapping of the nonuniform distribution of the local temperature inside the MEMS device further includes the step of applying electromagnetic energy to the MEMS device. In one more embodiment of the present invention, the step (A1) of performing 2-D mapping of the non-uniform distribution of the local temperature inside the MEMS device further includes the step of applying electrical energy to the MEMS device at a constant current level, at a constant power level, or at a constant voltage level.

In one embodiment of the present invention, the step (A) of detecting at least one defect in the MEMS device further includes the steps of: using secondary electron microscopy (SEM) imaging with substantially high spatial resolution to obtain a SEM image of the MEMS device, and comparing the SEM image of the MEMS device with a reference SEM image of the MEMS device to detect at least one defect. The step of comparing the SEM image of the EMS device with the reference SEM image of the MEMS device to detect at least one defect can be performed by using a computer-generated field of view or a human field of view to perform the comparison of the SEM image of the MEMS device with the reference SEM image of the MEMS device to detect at least one defect.

The step (A) of detecting at least one defect in the MEMS device can be also performed by (1) using ion beam imaging with substantially high spatial resolution, a visible imaging with substantially high spatial resolution including {an optical microscopy, or an optical interferometer microscopy}, an acoustic imaging with substantially high spatial resolution, a 3D X ray imaging with substantially high spatial resolution, a 2D X ray imaging with substantially high spatial resolution, or a scanning tunneling microscopy employing an atomic force means with substantially high spatial resolution in order to obtain a corresponding image of MEMS device, and by (2) comparing the obtained image of the MEMS device with a corresponding reference image of the MEMS device to detect at least one defect.

In one embodiment of the present invention, the step (A) of detecting at least one defect in the MEMS device resulted in detection of at least one electrical 'short' defect, wherein each electrical 'short' defect connects at least two electrical field lines, surfaces or volumes that are supposed to be disconnected, and wherein each electrical 'short' defect manifests itself as an area with a higher local temperature than temperature of the surrounding area. In this embodiment, the step (B) of performing repair of each electrical 'short' defect further includes: (1) using a process of physical direct bombardment of the area inside the MEMS device wherein the at least one electrical 'short' defect was detected by a focused beam of energy in order to heat and remove the defect; or (2a) using a process of physical direct bombardment of the area inside the MEMS device wherein the at least one electrical 'short' defect was detected by a focused beam of energy, and (2b) using a process of chemical reaction in the presence of a reactive gas to repair each electrical 'short' defect, wherein the reactive gas reacts with the material of the MEMS in the presence of the focused beam of energy that provides the energy necessary for the chemical reaction to occur, or (3) using an atomic force tip and a process of physical or proximity wear of the area in the MEMS device wherein the at least one electrical 'short' defect was detected to remove an undesirable material; or (4) using a robotic means to repair each defect. The focused beam of energy is selected from the group consisting of: {an ion beam, an electron beam, a coherent light (laser) beam, and a non-coherent light beam}.

In one embodiment of the present invention, the step (A) of detecting at least one defect in the MEMS device resulted in detection of at least one electrical 'open' defect, wherein the electrical 'open' defect disrupts at least one electrical field line that is supposed to be connected, and wherein each electrical 'open' defect manifest itself as an area with a lower local temperature than the temperature of the surrounding area. In this embodiment, the step (B) of performing repair of each electrical 'open' defect further includes: (1a) using a focused beam of energy to supply energy to each electrical 'open' defect, and (1b) depositing material to each electrical 'open' defect by using a photochemical reaction in the presence of a reactive gas between the gas and the material of the MEMS, wherein the electrical 'open' defect is eliminated when covered by the deposited material; or (2) using an atomic force instrument to deposit material to each electrical 'open' defect by using a process of direct material transfer, wherein the electrical 'open' defect is eliminated when covered by the deposited material; or (3) using a robotic means to repair each defect.

In one embodiment of the present invention, the step (A) of detecting at least one defect in the MEMS device resulted in detection of at least one physical obstruction defect; wherein the physical obstruction defect (POD) interferes with operation of MEMS device, In this embodiment, the step (B) of performing repair of each POD defect further includes: (1) using a focused beam of energy selected from the group consisting of {an ion beam, an electron beam, a coherent light (laser) beam, and a non-coherent light beam} to eliminate the POD physical defect; or (2) using one of the techniques selected from the group consisting of {an atomic force microscopy, and a scanning tunneling microscopy} to eliminate the POD physical defect; or (3) using a robotic means to repair each defect.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 3A shows the cross-sectional AA' view of MEMS device with the same mechanical defects as in FIG. 3.

FIG. 3B illustrates the cross-sectional BB' view of MEMS device with the same mechanical defects as in FIG. 3.

DETAILED DESCRIPTION OF THE PREFERRED AND ALTERNATIVE EMBODIMENTS

Figure 1:
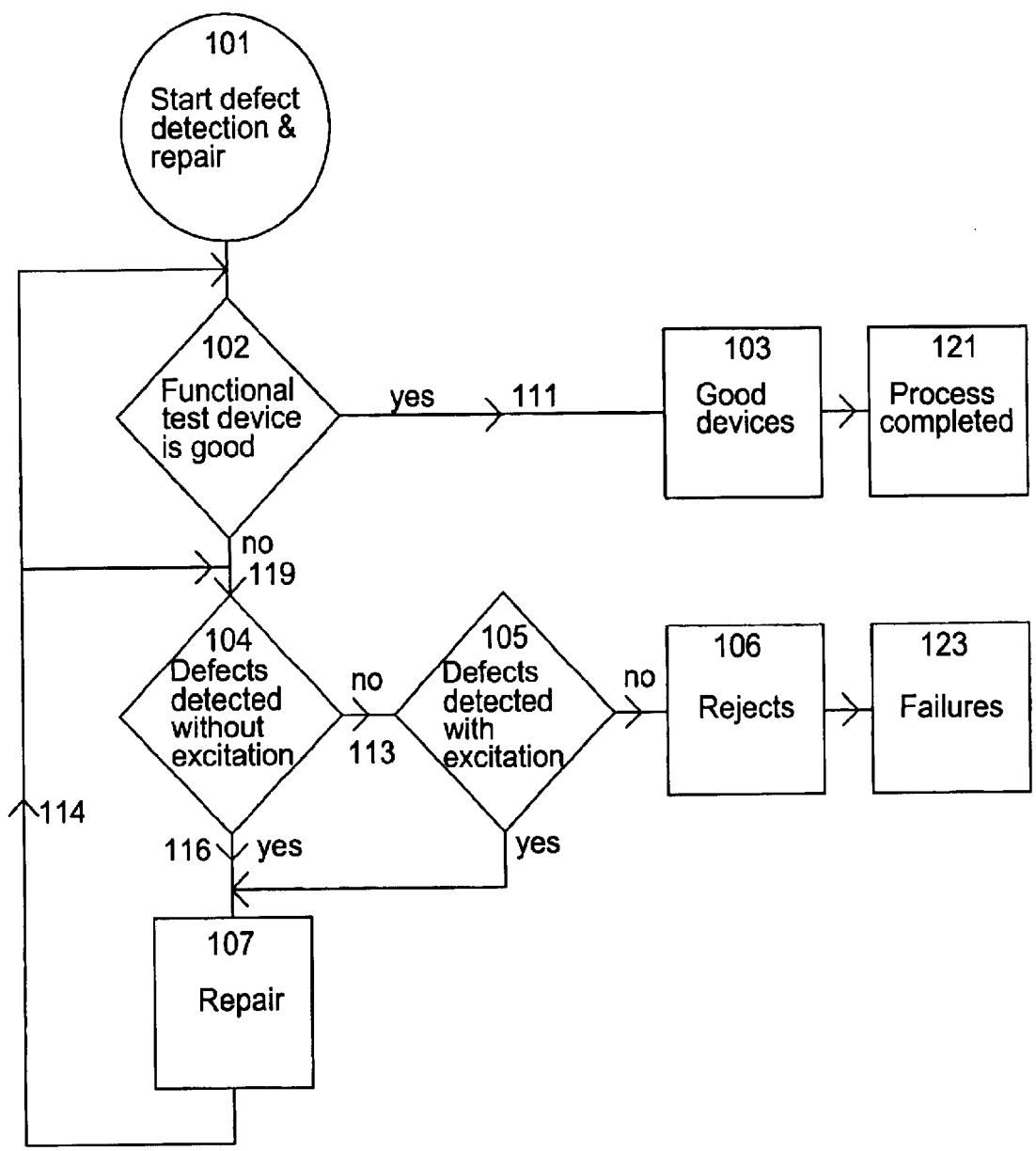
FIG. 1 depicts a flow chart of the method of the present invention to defect and repair of micro-electro-mechanical systems (MEMS) devices.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention is applicable not only to actuators, but also to sensors, or combinations of sensors and actuators. Micro-Electro-Mechanical Systems (MEMS) is the integration of mechanical elements, sensors, actuators, and electronics on a common silicon substrate or on several separate substrates through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices.

Microelectronic integrated circuits can be thought of as the "brains" of a system and MEMS augments this decision-making capability with "eyes" and "arms", to allow Microsystems to sense and control the environment. Sensors gather information from the environment through measuring mechanical, thermal, biological, chemical, optical, electrical and magnetic phenomena. The electronics then process the information derived from the sensors and through some decision making capability direct the actuators to respond by moving, positioning, regulating, pumping, and filtering, thereby controlling the environment for some desired outcome or purpose. Because MEMS devices are manufactured using batch fabrication techniques similar to those used for integrated circuits, unprecedented levels of functionality, reliability, and sophistication can be placed on a small silicon chip at a relatively low cost. There are numerous possible applications for MEMS.

EXAMPLE I

Biotechnology

MEMS technology is enabling new discoveries in science and engineering such as the Polymerase Chain Reaction (PCR) microsystems for DNA amplification and identification, micromachined Scanning Tunneling Microscopes (STMs), biochips for detection of hazardous chemical and biological agents, and microsystems for high-throughput drug screening, delivery and selection.

EXAMPLE II

Communications

High frequency circuits will benefit considerably from the advent of the Radio Frequency (RF)-MEMS technology. Electrical components such as tunable inductors, and tunable capacitors, filters, etc. can be improved significantly compared to their integrated bulk counterparts if they are made using MEMS technology. With the integration of such components, the performance of communication circuits will improve, while the total circuit area, power consumption and cost will be reduced. In addition, the mechanical switch, as developed by several research groups, is a key component with huge potential in various microwave circuits. The demonstrated samples of mechanical switches have quality factors much higher than anything previously available. Reliability and packaging of RF-MEMS components seem to be the two critical issues that need to be solved before they receive wider acceptance by the market.

EXAMPLE III

Accelerometers

MEMS accelerometers are quickly replacing conventional accelerometers for crash air-bag deployment systems in automobiles. The conventional approach uses several bulky accelerometers made of discrete components mounted in the front of the car with separate electronics near the air-bag; this approach costs over $50 per automobile. MEMS technology has made it possible to integrate the accelerometer and electronics onto a single silicon chip at a cost between $5 to $10. These MEMS accelerometers are much smaller, more functional, lighter, more reliable, and are produced for a fraction of the cost of the conventional macroscale accelerometer elements.

EXAMPLE IV

Applications of MEMS Actuators in Ultrasound and Optical Imaging

Numerous applications benefit from both high frequency ultrasound imaging and optical imaging techniques. High frequency ultrasound imaging is used in intracardiac and intravascular imaging as well as in imaging of the skin, eye, and small animals for genetic studies. Optical coherence tomography is an optical imaging technique analogous to ultrasound that makes images using reflected infrared energy from samples and also has applications in skin, eye, intravascular, and gastrointestinal imaging. A major issue in developing these systems is steering the acoustic and optical beams. Recent work has focused largely on the design, fabrication and testing of new types of ultrasound and optical beam scanning devices. These devices are fabricated from polyimide films using photolithography and use a linear polyimide MEMS actuator to mechanically scan the beams. This actuator, the integrated force array (IFA), is a network of hundreds of thousands of micron scale deformable capacitors that electrostatically contract with an applied voltage. Forward viewing tables pivoting on cantilever hinges and side scanning structures tilting on torsion hinges were fabricated on polyimide substrates with tables about 1.125 mm and 2.25 mm wide. These structures were modeled using one dimensional beam theory and ANSYS finite element analysis prior to fabrication. For the ultrasound probes, Piezo-electric transducers (PZT) were fabricated on these tables that operate at 20 MHz and 30 MHz. The transducer assemblies driven by MEMS actuators produced sector scans of 20–45° in air at resonant frequencies of 32 Hz to 90 Hz and sector scans in fluid of 6–8°. Both forward viewing and side scanning devices were then used in conjunction with a single channel high frequency ultrasound system to make real time images of wire phantoms. The optical scanning devices had gold-coated silicon mirrors mounted on the table in place of the PZT transducers. Only side scanning devices were developed for optical applications. For environmental protection, the devices were conformally coated with 50 nanometers of parylene. These devices were then used in the scanning arm of an optical coherence tomography imaging system for imaging of tissue.

EXAMPLE V

MEMS Actuators for Data Storage Industry

The magnetic hard disk drive (HDD) continues to maintain an areal recording density average compound growth rate of greater than 60% per year and a significantly lower cost per megabit. The areal density is the multiplication of track density and linear bit density. Currently, data storage industry is faced with the challenge of increasing the track density to the level of 0.25 of the bit density. This project aims at developing a MEMS based micro actuator to drive the read-write element in an HDD, and thus increase the accuracy in positioning the read/write heads for much higher track density. Recently designed and prototyped various Electrostatic, electromagnetic and piezoelectric MEMS based micro actuators are compatible with slider and head element process. The integrated systems including MEMS actuator, slider, head element and suspension are being investigated using micro-fabricated technology.

In one embodiment, FIG. 1 depicts a flow chart 100 of the method of the present invention focused on defect detection and repair of micro-electro-mechanical systems (MEMS) devices. After the start of the process of defect detection (block 101 of FIG. 1), the functional test is performed (block 102) to determine whether the MEMS device is functioning substantially properly, depending on nature of the particular MEMS device. (Please, see full discussion below). If the functional test proves that the MEMS device is functioning substantially properly (logical arrow 111 of FIG. 1), the MEMS device is a good one (block 103), and no repair is needed.

If, on the other hand, the functional test proves that the MEMS device is not functioning substantially properly (logical arrow 119 of FIG. 1), the MEMS device probably includes defects, either mechanical, or electrical, or both (please, see full discussion of the possible defects below). At this point, the defect detection step is to be performed, initially without excitation (block 104 of FIG. 1), to determine all possible defects, either mechanical, or electrical, or both. The defect detection process without excitation (block 104 of FIG. 1) is fully described below. If the defect detection process without excitation (block 104 of FIG. 1) results in finding of at least one defect (logical arrow 1116), either mechanical, or electrical, the next step is the step of repair, or elimination of the found defect (block 107 of FIG. 1). (Complete description of the repair process of a mechanical defect, or an electrical defect, is given below). After the step of repair is completed (logical arrow 114), the functional test 102 is performed again. If the MEMS device is functioning substantially properly (logical arrow 111), the MEMS device is a good one (block 103), and the defect and repair process is completed (block 121). If, on the other hand, the MEMS device is still not functioning substantially properly (logical arrow 119), the steps of defect detection without excitation (block 104) and repair (block 107) are preferably repeated until the MEMS device is functioning substantially properly (logical arrow 111), and the MEMS device becomes a good one (block 103).

If, on the other hand, the MEMS device is still not functioning substantially properly (logical arrow 119) even if the steps of defect detection without excitation (block 104) and repair (block 107) are preferably repeated, the decision should be made (logical arrow 113) to start detecting defects using various excitation schemes (step 105) (see detailed discussion below). A preferable excitation scheme is the one that generates the largest detection signal that can be captured in the human or in the computer-generated field of view. Please, see discussion below.

If, after the defect detection step with excitation is performed (step 105), and at least one defect, either electrical or mechanical is found, the next step is the step of repair (step 107), or elimination of the found defect(s). Again, the complete description of the repair process of a mechanical defect, or of an electrical defect, is given below. The steps of defect detection with excitation (step 105) and repair (step 107) are preferably repeated until the MEMS device satisfies the functionality test (block 102), that is the MEMS is functioning substantially properly (logical arrow 111), and the MEMS device becomes a good one (block 103). At this point, the defect and repair process is successfully completed (block 121).

If, on the other hand, even if after the steps of defect detection with excitation (step 105) and repair (step 107) are preferably repeated, or if the step of defect detection with excitation (step 105) fails to find at least one defect, and the MEMS device repeatedly fails the functionality test (block 102), the MEMS device cannot be repaired (step 106), and the defect and repair process ends in failure (block 123).

In one embodiment of the present invention, the two-steps detect-repair loops are sufficient. Indeed, after the biggest detection signal is found, and the biggest defects are repaired, the small defects can become visible and are eliminated in the second loop. See detailed discussion below.

Referring still to FIG. 1, in one embodiment of the present invention, the step (104—without excitation), the step (105— with excitation) of performing detection of at least one defect further includes the step of performing 3-D mapping of a non-uniform distribution of the local temperature inside the MEMS device. Indeed, the local MEMS defect changes the distribution of the local temperature inside the MEMS device and thus can be detected by performing 3-D mapping of the non-uniform distribution of the local temperature inside the MEMS device.

Referring still to FIG. 1, in another embodiment of the present invention, the step (104—without excitation), or the step (105— with excitation) of performing detection of at least one defect further includes the step of performing 2-D mapping of a non-uniform distribution of the local temperature on the surface of the MEMS device. Indeed, the local MEMS defect changes the distribution of the local temperature not only inside the MEMS device, but also on the surface of the MEMS device, and thus can be detected by performing 2D mapping of the non-uniform distribution of the local temperature on the surface of the MEMS device.

Figure 2:
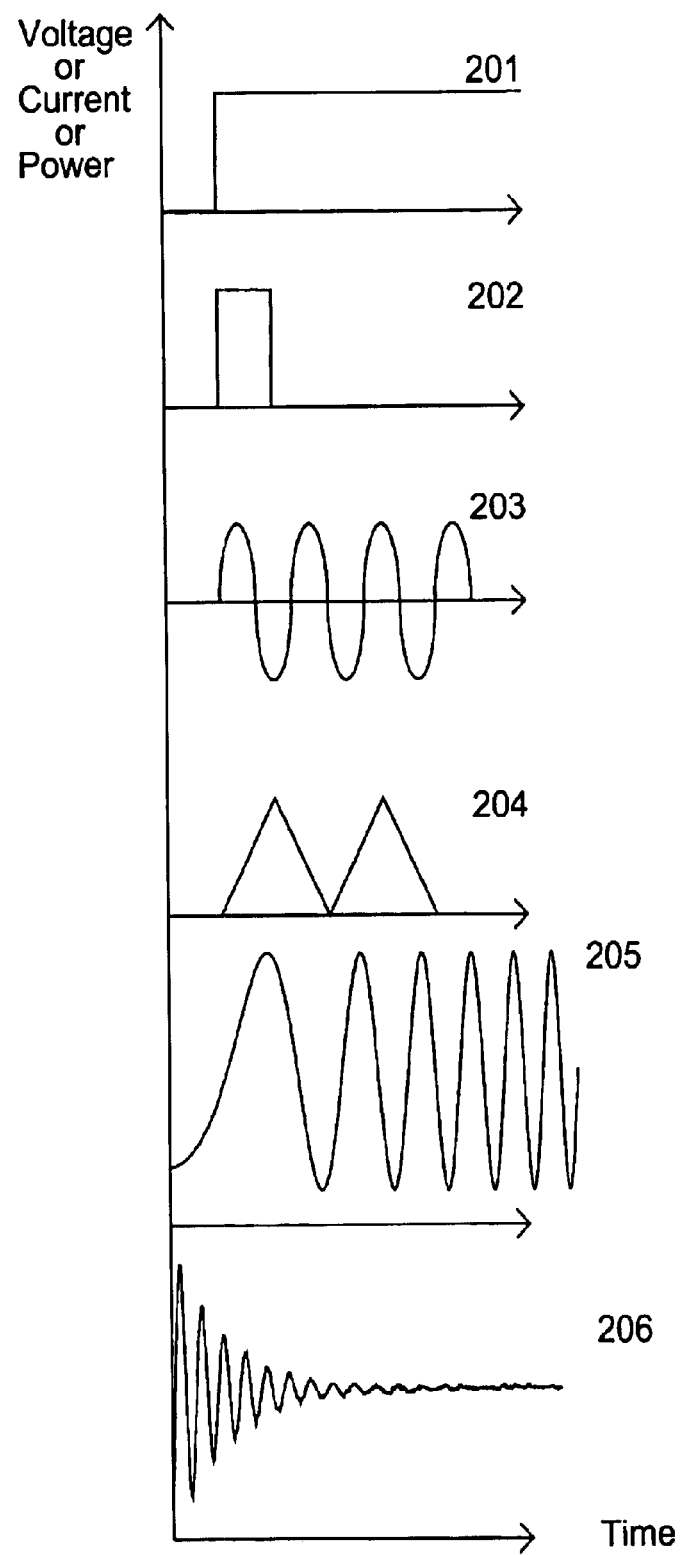
FIG. 2 shows how to apply different types of electrical energy to the MEMS device to perform 3-D mapping, or 2-D mapping of the non-uniform distribution of the local temperature (inside, or on the surface) of the MEMS device.

FIG. 2 shows how different types of electrical energy can be applied to the MEMS device to perform 3-D mapping, or 2-D mapping of the nonuniform distribution of the local temperature (inside, or on the surface) of the MEMS device or to functional testing. More specifically, in one embodiment of the present invention, the electrical energy is applied at constant level (curve 201 of FIG. 2) of voltage, current, or power. In another embodiment of the present invention, the specific pulse train of current, voltage, or power (curve 202) is applied. Parameters of the pulse train (amplitude, duration, duty cycle) can be selected based on application. In one more embodiment of the present invention, the specific sinusoidal wave of current, voltage, or power (curve 203) is applied. Parameters of the sinusoidal wave (amplitude, period) can be selected based on application. In one additional embodiment of the present invention, the specific saw-tooth wave of current, voltage, or power (curve 204) is applied. Parameters of the saw-tooth wave (amplitude, period) can be also selected based on application. Yet, in one more embodiment of the present invention, an aperiodic sinusoidal wave (curve 205), or a sinusoidal wave with a damping factor (curve 206) of current, voltage, or power is applied. Parameters of the aperiodic sinusoidal wave (curve 205), or parameters of the sinusoidal wave with the damping factor (curve 206) can be also selected based on application. Other excitation waveforms can also be applied to MEMS devices.

Figure 3:
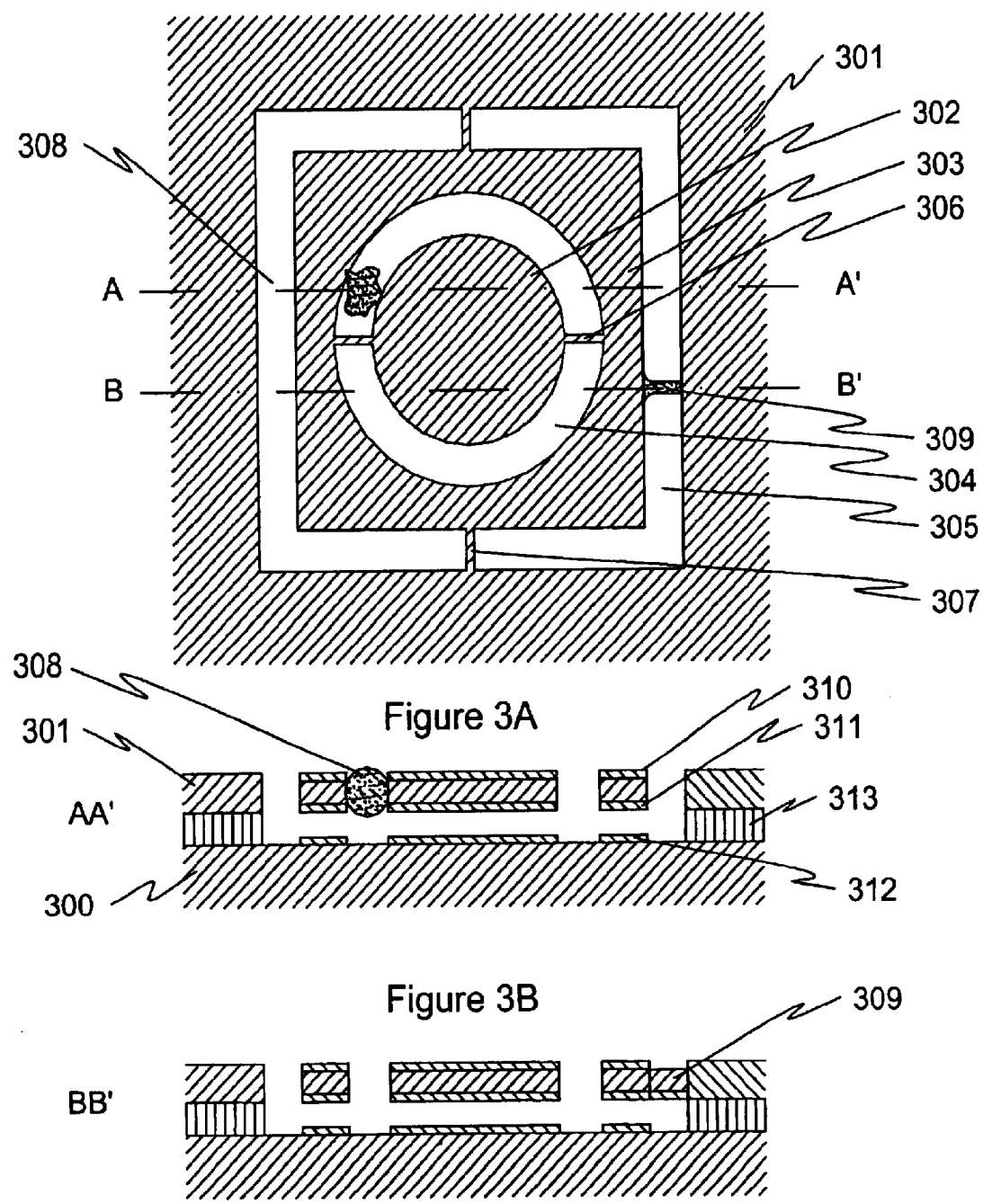
FIG. 3 depicts a plain view of the MEMS device including typical mechanical defects.

In FIG. 3 depicts a plain view of the typical mechanical defects 308, and 309, inside MEMS device. FIG. 3A shows the cross-sectional AA' view of the MEMS device with the same mechanical defects 308, and 309, whereas FIG. 3B illustrates the cross-sectional BB' view of the MEMS device with the same mechanical defects 308, and 309. Device example in FIG. 3 is the biaxial, bi-directional electrostatic actuator. The following description can be found in Handbook of "Microlithorgarphy, Micromachining, and Microfabrication", Volume 2, published d by the SPIE Optical Engineering Press, in 1997. An electrostatic actuator in its simplest form has a movable planar electrode and a fixed electrode. The electrostatically generated pressure:

$$P_{el} \tfrac{1}{2}\epsilon_0 (V/d)^2 \quad (1)$$

where $\epsilon_0$ is the dielectric constant of the material between the plates, d is the spacing between the plates, and V is the applied voltage. The generated pressure of the actuator is inversely proportional to the second power of the spacing. The nonlinear force of this actuator is susceptible to snap-in, where the electrostatic force overwhelms a linear restoring (spring) force, when the gap is about one-third of the initial gap.

One example of the usage of the biaxial, bi-directional electrostatic actuator is based on two-directional, macroscopic electromagnetic galvanometer actuators fabricated with discrete mirrors, coils and magnets such as those used in optical recording drives. Several different technologies for driving and fabricating the mirror arrays and controlling the deflections of the mirrors in the arrays are employed in different embodiments. Driving technologies include electrostatic, electromagnetic, piezoelectric, thermally activated mirrors, and other types of driving technologies. Two independent electric currents pass through two separate current loops, and two sets of magnetic fields are applied so that the current, magnetic field and resulting torque vectors are all perpendicular to each other. Electromagnetic galvanometer mirrors fabricated with multiple electrical turns around the mirror and the inner frame and two sets of magnets represent one implementation of two-dimensional rotating actuator. In other embodiments, the mirror arrays are Micro Electro Mechanical Systems (MEMS), which provide improved performance and low cost.

FIGS. 3, 3A, and 3B show one embodiment of a controllable MEMS mirror system 301 controlled by an electrostatic driving technology. FIG. 3 shows a top view, whereas FIGS. 3A and 3B show side views. The MEMS mirror system 301 includes a mirror 302. In the embodiment illustrated in FIGS. 3, 3A, and 3B, the mirror has a circular shape. In other embodiments, the mirror 301 is rectangular or of another shape. As seen in FIG. 3, the MEMS mirror system 301 has two sets of hinges 306 and 307 that are placed perpendicularly to each other so that each hinge pair allows angular deflection around their respective axes. The outer set of hinges 307 allows one directional rotation of the inner frame 303 with respect to the outer frame 305. The inner set of hinges 302 allows one directional rotation of the mirror 304 with respect to the inner frame around axis that is perpendicular to the outer rotation axis.

The mirror 304 and inner frame 303 are made of electrically conducting material (e.g. doped silicon) or of nonconducting material (e.g. undoped silicon) that is coated with electrically conducting film on the bottom side (light is reflected from the top side of mirror 304). This bottom conductive side is connected to a common electrode 311 that is typically kept at ground. Film material and thickness on the top and bottom of the mirror and inner frame are typically substantially the same in order to avoid distorting the mirror by differential stress. Cr, Ta, Ti, and other metals are used below the optically reflecting film to improve adhesion of metals such as Au to the mirror surfaces. The driving electrode structure is defined below the mirror with an air gap (not shown) that is adjusted according to mirror dimensions, desired deflection angles, torque constants of hinges and voltages planned for full deflections (typically equal to 30% of the air gap between two plates of parallel capacitor to avoid snapping instability of the mirrors).

In some embodiments, the actuators are two-directional electrostatic rotational comb actuators (not shown). In electrostatic rotational comb actuators, rotational motion is generated by attractive forces between oppositely charged combs of an edge capacitor. Two sets of hinges are employed to provide rotational motion in two directions. Up to six leads connect electrical voltage sources with combs. For large arrays, leads are routed along the walls of the top wafer onto the lower wafer that contains driving electronics. Rotational comb designs have leads incorporated on movable electrodes and no bottom electrodes are required. The leads are brought along the walls toward the bottom wafer that contains driving electronics. The interconnections between the top and bottom wafers are fabricated with solder reflow. For reference, please see U.S. Pat. No. 6,483, 962.

Each mechanical defect can manifest itself as an area with a higher local temperature than temperature of the surrounding area when under excitation and when defect bridges electrically regions of different electrical potential because each such mechanical defects generates an energy and therefore causes local heating to occur. Typically, a mechanical defect is a piece of dirt, or a leftover from etching process that was not etched to the end.

Figure 4:
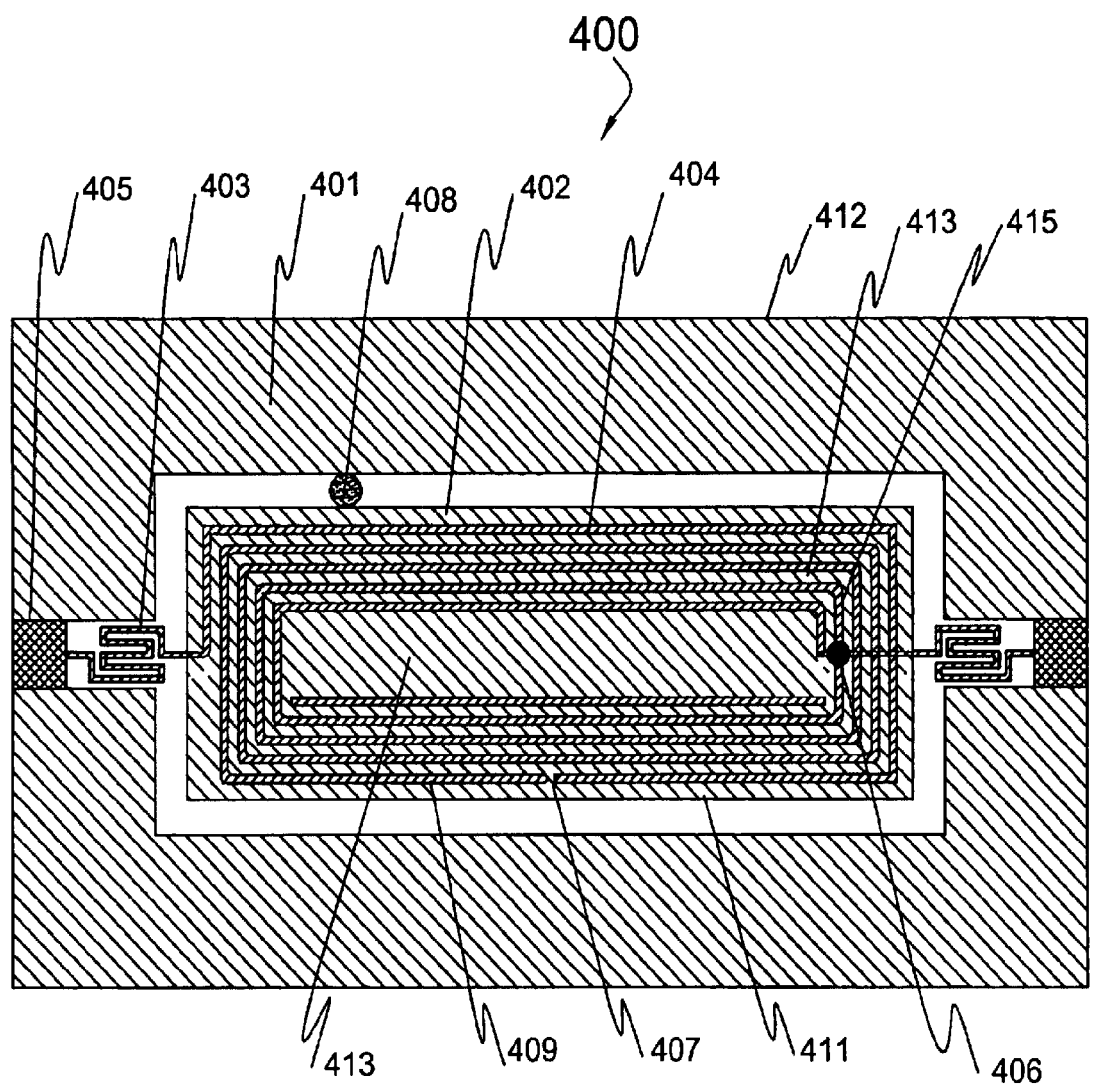
FIG. 4 illustrates a 'short' electrical defect that connects at least two electrical field lines that are supposed to be disconnected, shows an 'open' electrical defect that disconnects at least two electrical field lines that are supposed to be connected, and depicts a physical obstruction defect.

FIG. 4 represents an example of another actuator of uniaxial, bi-directional electromagnetic actuator. Similar to the electrostatic actuators, this electromagnetic actuator also has a movable part formed on one substrate 412 and a stationary part formed on another substrate (not shown). The substrate 412 is patterned to have a movable membrane 413 and two spring hinges 403 to movably engage the membrane 413 to the other stationary part 405 of the substrate 412 for rotation around the rotational axis defined by the hinges 403. A coil 409 of conductive wires is formed and fixed to the membrane 413. The support and the micro blade (not shown) are fabricated as integral part of the movable membrane 413 and thus move with the coil 409. The coil 409 is electrically connected to the surrounding substrate 405 with conductive leads that run along hinges 403 to receive a driving current from an external current source.

The disclosed above structure for rotational actuator designs may also be used to construct other types of actuators. For example, a piezo-electrical transducer may be used and formed on the top substrate to cause the movement of the micro blade. In addition, a thermal element may be used to cause the movement of the micro blade through thermal expansion. Furthermore, the actuator may be designed to cause linear motion of the micro blade.

Referring still to FIG. 3A, the uniaxial, bi-directional electromagnetic actuator 30 includes a 'short' electrical defect 308 that connects at least two electrical field lines 310 and 311 that are supposed to be disconnected. Each electrical 'short' defect manifests itself as an area with a higher local temperature than temperature of the surrounding area when under excitation because the 'short' defect needs an additional electrical energy that is dissipated at the junction of low resistance and high electrical current.

FIG. 4 also depicts an 'open' electrical defect 406 that disconnects at least two electrical field lines 413 and 415 that are supposed to be connected. Each electrical 'open' defect manifests itself as an area with a lower local temperature than temperature of the surrounding area when device is under excitation.

In addition to being a pure electrical, or to being a pure mechanical defects, a defect can be both a mechanical defect and an electrical defect. For instance, a piece of dirt, being a mechanical defect, can also cause shortage of between electrical lines, if this particular piece of dirt is a piece of metal, or a piece of a conductor, and if it happens to occupy a location where it can cause connection of at least two electrical lines, surfaces or volumes that are supposed to be electrically disconnected.

In one embodiment of the present invention, the step of detecting at least one defect in the MEMS device further includes the steps of (1) using visible imaging with substantially high spatial resolution to obtain a visible image of the MEMS device, and (2) comparing the visible image of the MEMS device with a reference visible image of the MEMS device to detect at least one defect.

Figure 5:
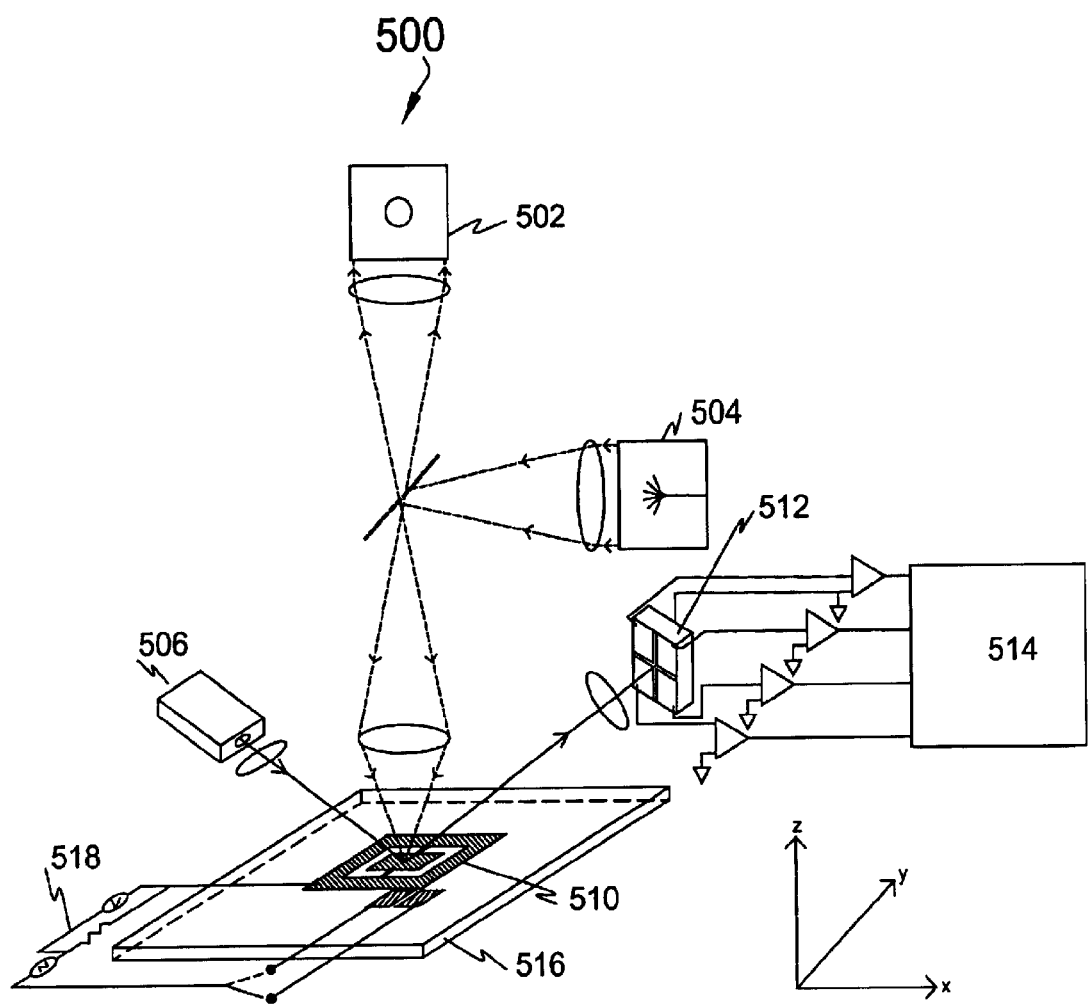
FIG. 5 depicts an apparatus that performs a visible imaging of the MEMS device in order to detect at least one visible defect in the MEMS device.

More specifically, in one embodiment of the present invention, FIG. 5 depicts an optical microscopy and position sensing apparatus 500 used to perform the above identified steps of: (1) obtaining a visible image of the MEMS device, and (2) comparing the visible image of the MEMS device with a reference visible image of the MEMS device to detect at least one visible defect. For example, a visible MEMS defect is an optical defect that prevents the proper optical function of the device, for instance, the optical surface 'defect' is present if the mirror coating is missing in some areas of MEMS device.

In one embodiment, the apparatus 500 includes a visible charge coupled device (CCD) camera 502. Many companies, including Panasonic, designs and manufactures industrial CCD cameras to process measurement, quality control, test and measurement, high speed analysis, and more, including 3 CCD Color Cameras, Single CCD Color Micro Head Cameras, Machine Vision Cameras, etc. Panasonic 3 CCD Color Cameras feature the latest advances in CCD and digital signal processing (DSP) technology. In addition to their high performance characteristics (up to 800 lines of color resolution), the camera heads are exceptionally compact which allows them to be easily mounted in tight places. Single CCD Black and White and Color Micro Head Cameras: Panasonic Single CCD Color Micro Head Cameras deliver high performance and versatility and are available in models to fit virtually any industrial imaging application, such as non-destructive test and analysis. For reference, please see the web link: www.panasonic.com.

Referring still to FIG. 5, in one embodiment, the apparatus 500 further includes a light source 504, a laser source 506 (for purposes of optical position sensing), a MEMS actuator or sensor 510, that is a target MEMS device that is tested for presence of defects, a translation stage 516 that moves device in x, y and z directions and provides coordinates of the location of possible defects, a MEMS excitation device 518 that provides the excitation electromagnetic energy to the MEMS device if the optical sensing without excitation fails to find defects, and a sensing electronics 514 including a two dimensional position sensor 512 that is used to measure functional performance of the MEMS devices. It is known to a person skillful in the art how to use the apparatus 500, or its possible modifications and variations in order to (1) obtain a visible image of the MEMS actuator 510, and (2) to compare the visible image of the MEMS actuator 510 with a reference visible image of the MEMS actuator 510 to detect at least one visible MEMS defect.

Preferably, the visible imaging with spatial resolution around 0.5 micrometers should be used for the purposes of the present invention.

In one embodiment of the present invention (not shown), the step of detecting at least one defect in the MEMS device further includes the steps of (1) using secondary electron microscopy (SEM) imaging with substantially high spatial resolution to obtain a SEM image of the MEMS device, and (2) comparing the SEM image of the MEMS device with a reference SEM image of the MEMS device to detect at least one defect. Secondary electron microscopy, or SEM, is used to examine physical features with dimensions from several microns down to a few nanometers. First developed in the 1930s, SEM utilizes a densely focused beam of electrons, 2 to 30 keV, that is rastered over the examination area. Secondary electrons emitted from the surface are detected and in synchronization with the raster, their intensity is displayed on a monitor. In the present invention, the secondary electron microscopy (SEM) imaging preferably with very high spatial resolution, down to few nm, should be used to detect at least one MEMS defect.

Figure 6:
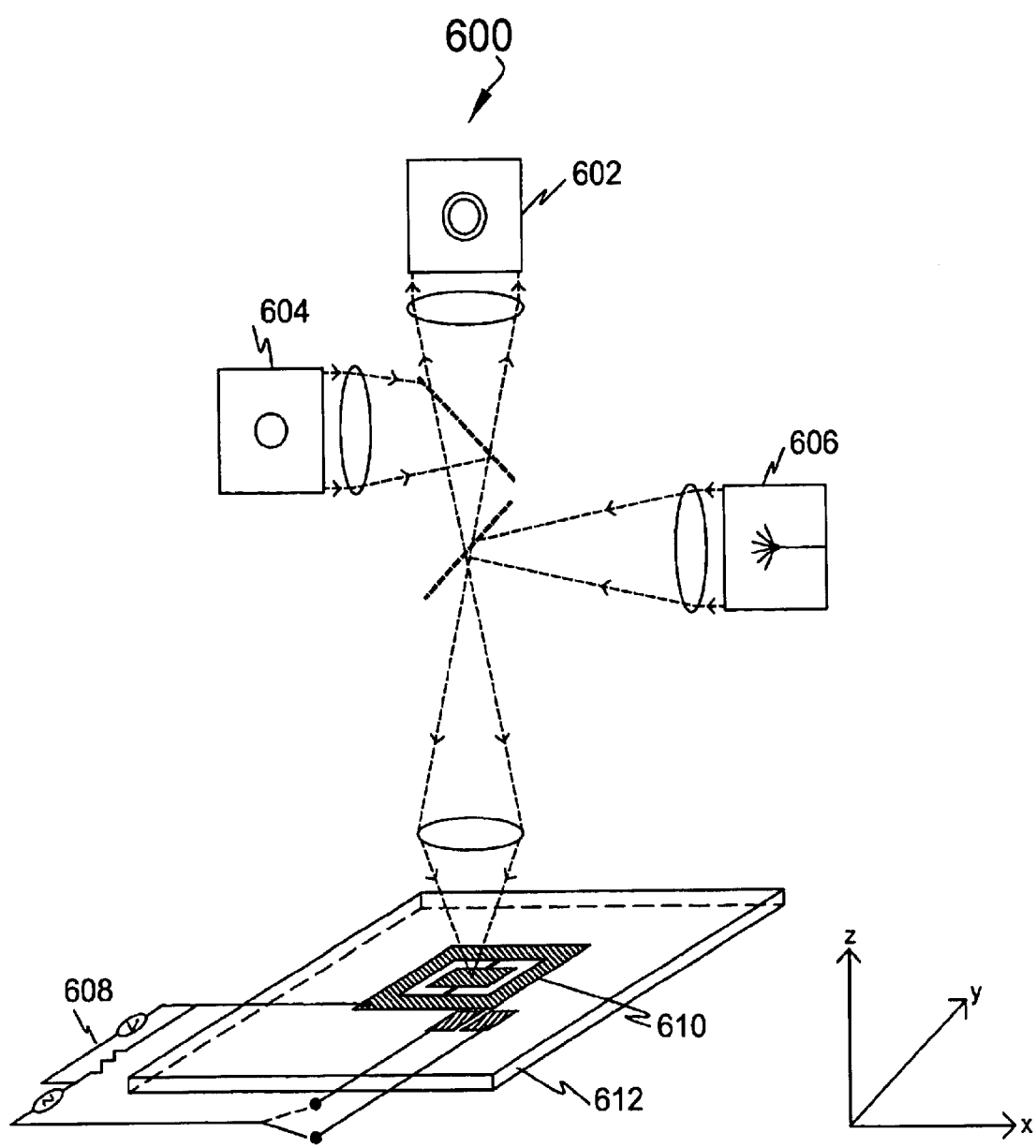
FIG. 6 illustrates an apparatus that performs an optical microscopy and thermal imaging to detect at least one defect in the MEMS device.

In one embodiment of the present invention, shown in FIG. 6, the apparatus 600 capable of performing an optical microscopy and thermal imaging is employed to detect at least one defect in the MEMS device. In one embodiment, the apparatus 600 (1) performs 2-D thermal imaging with substantially high spatial resolution to obtain a 2-D thermal image of the MEMS device, and (2) compares the 2-D thermal image of the MEMS device with a reference 2-D thermal image of the MEMS device to detect at least one defect.

In one embodiment, the apparatus 600 includes a thermal imaging camera 602, a visible CCD camera 604, a light source 606, a MEMS excitation source 608, a target MEMS actuator 610 that is being tested for presence of possible defects, and a translation stage 612 configured to perform the detected defects location measurements. It is known to a person skilled in the art how to use the apparatus 600 of FIG. 6 in order to perform the 2-D thermal imaging of the MEMS actuator 610, with or without the excitation device 608, to obtain a 2-D thermal image of at least one MEMS defect on the surface of the MEMS actuator 610. Similarly, the apparatus 600 can be employed to perform the 3-D thermal imaging of the MEMS actuator 610, with or without the excitation device 608, to obtain a 3-D thermal image of at least one MEMS defect inside the MEMS actuator 610. Preferably, the infrared imaging in the wavelength range 2–10 micrometers and with spatial resolution down to 2 micrometers should be used for the purposes of the present invention. However, the infrared imaging with subwavelength resolution down to less than 2 micrometers is also very useful for the purposes of the present invention.

In one embodiment, the thermal imaging camera 602 can be implemented by using a Target Location Viewer manufactured by Accurate Locators, Inc. For reference, please, see web link: www.accuratelocators.com.

The Target Location Viewer is a true thermal imaging device that creates pictures based on heat energy emitted by the viewed scene rather than light reflected off of it. Heat in the infrared region of the electromagnetic spectrum behaves much like visible light and can be optically focused and collected. Infrared thermal imagers employ various materials whose electrical properties change when exposed to infrared photons heated to perform the transformation from infrared energy to electronic signal levels. These changing signal levels are translated into video signals in which a different shade of gray or color on the TV monitor is assigned for each detectable temperature (i.e. emitted energy) level.

Figure 7:
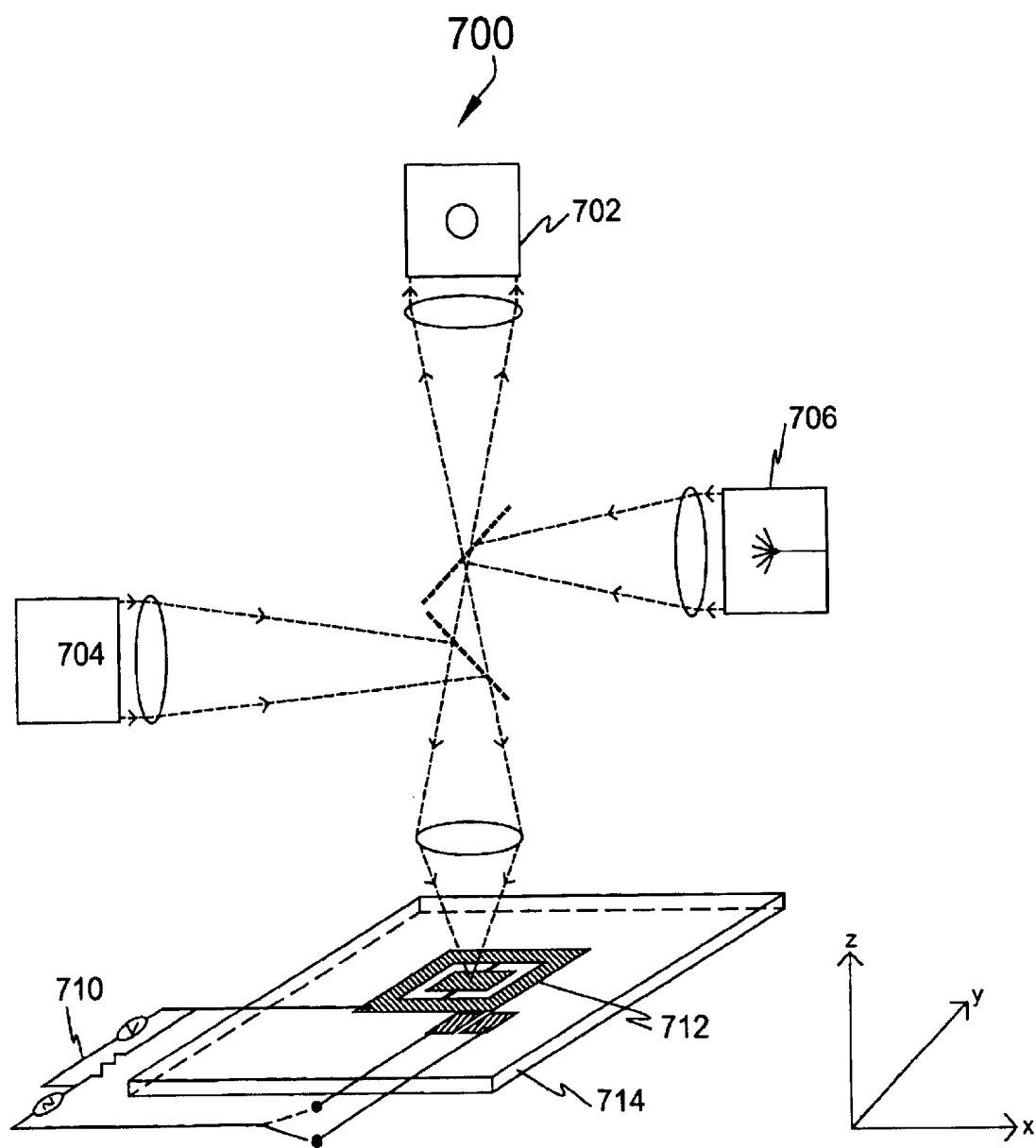
FIG. 7 shows a simplified version of an apparatus used to perform optical microscopy and laser Doppler velocimetry on MEMS device to detect at least one defect.

In one embodiment of the present invention, shown in FIG. 7, the (simplified version) of apparatus 700 is used to perform optical microscopy and laser Doppler velocimetry on MEMS device to detect at least one defect in the MEMS device. In one embodiment, the (simplified version) apparatus 700 (1) performs optical microscopy and scanning laser Doppler velocimetry to obtain a laser Doppler (LD) image of the MEMS device, and (2) compares the LD image of the MEMS device with a reference LD thermal image of the MEMS device to detect at least one defect. The apparatus 700 includes a visible CCD camera 702, a scanning laser Doppler velocimetry device 704, a light source 706, a MEMS excitation device 710, a target MEMS actuator 712, and a measurement translation stage 714. Doppler Global Velocimetry/DGV or Planar Doppler Velocimetry/PDV, was first described in a US patent by Komine (U.S. Pat. No. 4,919,536), in 1990. In particular, since DGV (or PDV) relies on Doppler shift light scattering (single exposure) by clouds of particles at (high concentration) carried by the flow, rather than the imaging of each individual particle, it has the ability to generate velocity vector field information globally more quickly than LDA, and over a plane of larger area (~3×3 m2) than that for DPIV. Each pixel within the sensor array could yield a potential velocity vector, therefore, a mega pixels imaging camera would potentially output a million velocity vectors at video rate. In DGV, the velocity information is obtained by means of an optical & spectroscopic frequency converter (a pre-selected linear spectral line optical transfer function), known as an absorption line filter (ALF), that transforms the Doppler shifted frequency of light scattered by the particles (~0.5 to 5 microns (in air)) in the flow to real intensity variations in the imaging plane. Once this transformation is completed, the converted Doppler signal intensity map can then be processed by light intensity detectors (CCD camera) and computers to obtain a velocity map of the flow of interest. To eliminate the problem of both scattering signal and illumination intensity variations spatially in the measurement window, the Doppler signal intensity map is normalized by a reference intensity map from the same view of the flow. The measurement area within the flow field is defined by the position and physical dimension of a fan of laser light and the measured velocity component is dependent on the direction of laser sheet propagation and the CCD camera viewing angle.

In one embodiment of the present invention (not shown), the step of detecting at least one defect in the MEMS device further includes the steps of (1) using secondary electron microscopy (SEM) imaging with substantially high spatial resolution to obtain a SEM image of the MEMS device, and (2) comparing the SEM image of the MEMS device with a reference SEM image of the MEMS device to detect at least one defect.

In one embodiment of the present invention (not shown), the step of detecting at least one defect in the MEMS device further includes the steps of (1) using focused ion beam imaging with very high spatial resolution (down to few mm) to obtain a focused ion beam (FIB) image of the MEMS device, and (2) comparing the FIB image of the MEMS device with a reference FIB image of the MEMS device to detect at least one defect.

The FIB system is similar to that of SEM, the major difference being the use of a gallium ion (Ga+) beam instead of an electron beam. The ion beam is generated in a liquid-metal ion source (LMIS), and the application of a strong electric field causes emission of positively charged ions from a liquid gallium cone, which is formed on the tip of a tungsten rod. Modern FIB systems involve the transmission of a parallel beam between two lenses. A set of apertures is used to select the beam current and hence the beam size and image resolution. The beam energy is typically 30 or 50 keV with a beam current in the range of 1 to 20 nA, and the best image resolution that can be obtained is approximately 5–7 nm. The beam is raster-scanned over the sample, which is mounted in a vacuum chamber at pressures of around 10-7 mbar. When the beam strikes the sample, secondary electrons and secondary ions are emitted from its surface. The electron or ion intensity is monitored and used to generate an image of the surface. Secondary electrons are generated in much greater quantities than ions and provide images of better quality and resolution; consequently the secondary electron mode is used for most imaging applications. Image contrast is determined by the material's composition and topography. The ion beam is positively charged so insulating or electrically isolated materials will become positively charged upon exposure. These materials will therefore have a low emission of secondary electrons and appear dark in a secondary image. This is in contrast to conducting materials, which are bright. In crystalline materials such as aluminum, copper and tungsten, the ion-beam penetration depth can vary due to channeling along open columns in the lattice structure. The rate of emission of secondary electrons or ions is function of penetration depth. Therefore FIB can be used to image crystallite grains, revealing crystal orientations. The yield of the secondary electrons increases with the angle of incidence of the ion beam, providing a technique for obtaining images with topographical contrast.

In one embodiment of the present invention (not shown), the step of detecting at least one defect in the MEMS device further includes the steps of (1) using dual beam FIB to obtain a dual beam FIB (DBFIB) image of the MEMS device, and (2) comparing the dual beam FIB image (DBFIB) of the MEMS device with a reference DBFIB image of the MEMS device to detect at least one defect.

Dual Beam FIB has an electron column in addition to an ion column, which allows for high resolution imaging. In addition to creating a finer beam, an advantage of using electrons instead of ions for imaging is that surface features are better preserved because much less sputtering occurs from the impinging electrons. This is particularly important for TEM sample preparation where surface features are often the area of interest. The dual beam is also useful for creating cross sections of IC's with an ion beam and then imaging with the electron beam to locate inconsistencies in metal layers and vias for failure analysis.

In one embodiment of the present invention (not shown), the step of detecting at least one defect in the MEMS device further includes the steps of (1) using visible and near infrared imaging to obtain a visible and near infrared (V&NI) image of the MEMS device, and (2) comparing the V&NI image of the MEMS device with a reference V&NI image of the MEMS device to detect at least one defect.

Modern vision and imaging applications rely on interpretation of information acquired by an image sensor. Typically the sensor is designed to emulate human vision resulting in a color or monochrome image of the field of view as seen by the eye. This is accomplished by sensing light at wavelengths in the visible spectrum (400–700 nm). However, additional information can be gained by creating an image based on the light that is outside the sensitivity of the human eye. The information available can be maximized by combining information found in multiple spectral bands. The photonic spectrum includes energy at wavelengths ranging from the X-rays to ultraviolet. The color image from a Charge Coupled Device (CCD) array is acquired by sensing the wavelengths corresponding to red, green, and blue light. CCD sensors are capable of detecting light beyond the visible wavelengths out to 1100 nm. The wavelengths from 700 nm to 1100 nm are known as the near infrared (NIR) and are not visible to the eye. In standard color video cameras the infrared light is usually blocked from the CCD sensor because it interferes with the quality of the visible image. DTI's Multispectral cameras give an access to the full power of the CCD's capabilities by providing one imaging array that performs color imaging and two more that sense the invisible light from 700–1100 nm. The wavelengths detected by each array can be further limited by adding narrowband optical filters in the imaging path. Combining the information from all three sensors provides image data in five spectral bands—red, green, blue, and the two infrared bands.

The ability to "see" objects with a camera and detect color is a powerful tool. By processing the data from an image, additional information can be extracted. Multispectral imaging expands the camera's capability to include the power to image features that can not be seen with the eye. By selectively combining both visible and infrared images, the available information from a field of view can be maximized. Multispectral imaging can achieve more than one type of vision task with a single camera. Markings or bar codes that are visible in the color image are absent in the infrared image, simplifying automated inspection. Colors and patterns disappear in the infrared. In electronics inspection, printed circuit board traces are more clearly identified in the infrared. Problem areas such as MEMS device contamination by physical defects can be more easily pinpointed. The different characteristics of spectral imaging can provide a number of unique advantages in vision systems. The longer wavelengths of infrared penetrate MEMS surface better than visible wavelengths, resulting in enhanced visibility of 3-D defects. Differences in spectral reflectivity can distinguish different objects that appear the same in the visible.

In one embodiment of the present invention (not shown), the step of detecting at least one defect in the MEMS device further includes the steps of (1) using acoustic microscopy imaging to obtain an acoustic microscopy (AM) image of the MEMS device, and (2) comparing the AM image of the MEMS device with a reference AM image of the MEMS device to detect at least one defect.

Acoustic microscopy is a relatively new technique rapidly becoming established as a method for non-destructive evaluation of engineering materials. The lateral resolution of Scanning Acoustic Microscopy (SAM) is dependent on the wavelength frequency of the acoustic waves and, at best, is down to 0.75 microns. The idea of quantitative acoustic microscopy is to utilize the focused acoustic beam to measure velocities of different types of acoustic waves propagating in solid media. Acoustic microscopes used for characterization of the elastic properties of solids can conveniently be divided into two main groups: conventional microscopy and time-resolved microscopy. In conventional acoustic microscopy, a monochromatic sound wave is focused onto a specimen by means of an acoustic lens. At the top of the lens is a piezoelectric transducer. The bottom lens face is ground into a spherical or cylindrical cavity, which is coated with a quarter-wavelength matching layer. The same lens is used to record the signal reflected back from the sample. A liquid coupling, usually water, is put between the lens and the sample. The spherical lens, i.e. the lens with a spherical cavity, focuses sound onto a spot with a size comparable to the sound wavelength in the fluid. Variation of the mechanical properties with depth can be studied by scanning at various defocus values. C-scan acoustical images obtained at different defocus positions were used for the detection of subsurface voids and cracks. Collecting images obtained at various defocus positions allows a three-dimensional image to be constructed, representing the volume of the entire microstructure of the investigated sample. The recently developed theory of three-dimensional imaging (Zinin et al., 1997) facilitates the quantification of the properties of the subsurface. Unfortunately, scanning in three dimensions (3-D) is time consuming. For large specimens the time-of-flight method can be used for scanning in three dimensions. Time-resolved acoustic microscopy adds an additional degree of freedom for quantitative measurement, namely time. In time-resolved acoustic microscopy a short sound pulse is sent toward a sample. The time-of-flight method uses the acoustical contrast to describe the time required for the pulse sent into the sample to return to the acoustic lens. For layered materials the reflected signal represents a train of pulses (A-scan). The first pulse is attributed to the reflection from the liquid/specimen interface. The second pulse appears as a result of reflection from the internal interface. The time delay of the pulses and their amplitudes provides information about the elastic properties and attenuation of sound in the layer. The velocity of the wave can be determined by measuring the time delay of the corresponding pulse. Time resolved images obtained by mechanical scanning along a line are called B-scans. The B-scan produces a section view through the sample. C-scan images are obtained when the signal is recorded at a chosen time delay (gate position) during mechanical area scanning. By varying the gate position it is possible to produce acoustical images of different layers within the sample (3-D imaging). The time delay is measured relative to the pulse from the top surface, of the sample.

In one embodiment of the present invention (not shown), the step of detecting at least one defect in the MEMS device further includes the steps of (1) using 2D x ray imaging with substantially high spatial resolution to obtain a multiple cross sectional x ray image (2D-XI) of the MEMS device, and (2) comparing the 2D-XI image of the MEMS device with a reference 2D-XI image of the MEMS device to detect at least one defect.

In another embodiment of the present invention (not shown), the step of detecting at least one defect in the MEMS device further includes the steps of (1) using 3D x ray imaging with substantially high spatial resolution to obtain a multiple cross sectional x ray image (3D-XI) of the MEMS device, and (2) comparing the 3D-XI image of the MEMS device with a reference 3D-XI image of the MEMS device to detect at least one defect.

A relatively new X-ray imaging technique has made its first foray into the third dimension. Using a computer algorithm and high energy X rays, researchers were able to visualize two nanometer-scale, etched patterns stacked one on top of the other. This technique allows one to perform atomic-scale probing of irregular structures such as material defects in MEMS devices. X-ray microscopy along the lines of light microscopy resolves at best down to 30 nanometers because X rays are difficult to focus. So for many applications researchers turn to diffraction, which requires a crystal, but can achieve resolutions of a few A or better. Crystal diffraction creates a pattern of spots of varying intensities and positions related to the repetitive arrangement of atoms within the sample. Constructing a holographic image from two X-ray beams is one potential option for imaging these holdouts, but there is a way of doing it with one beam. Non-crystalline formations produce weak and continuous diffraction patterns—rather than spots—in which every point contains some information about the original structure. "Oversampling" this pattern with a detector that has many pixels can extract enough information to reconstruct the sample structure. So far physicists have used this new technique to image only two-dimensional slices of 3D objects.

Now Jianwei Miao of Stanford University and his colleagues have condensed a series of these oversampled diffraction patterns into a simple 3D structure for the first time, making use of a powerful x ray source and a computer algorithm they developed. Their sample was a pair of nanoscale patterns-each one included a simulated DNA strand, a circuit pattern, and a star—etched in nickel with an electron beam and sandwiched together. They hit the object at 30 different angles with 6 keV x rays from the SPring-8 synchrotron at the Institute of Chemical and Physical Research (RIKEN) in Japan, then mapped each of the diffraction patterns onto a three-dimensional coordinate system. Information garnered from oversampling gradually builds up a 3D view from an initial random reconstruction of the structure. They resolved the target down to 50 nanometers. The particular method used here has some drawbacks. Indeed, the calculations are complicated, and taking multiple views at different angles can be imprecise. Potential applications include imaging MEMS devices, disordered materials and biological samples such as cells and viruses. And because the method doesn't require crystals, it could potentially image single molecules, perhaps in conjunction with a free electron laser. It requires the usage of a large facility that provides an X-ray laser beam.

In another embodiment of the present invention (not shown), the step of detecting at least one defect in the MEMS device further includes the steps of (1) using scanning tunneling microscopy employing or an atomic force means with substantially high spatial resolution to obtain a scanning tunneling image or an atomic force image (AFI) of the MEMS device, and (2) comparing the AFI image of the MEMS device with a reference AFI image of the MEMS device to detect at least one defect.

Scanning Tunneling Microscopy (STM) is an analytical technique based on the quantum mechanical phenomenon called tunneling. Tunneling is the phenomenon by which a high potential barrier does not eliminate the possibility of finding a particle in a region of high potential or even beyond a region of high potential.

The idea behind STM is that there is a certain driving force for an electron to want to move from one surface to another surface of lower potential. Classically, however, this is not possible without a direct connection, say a wire connecting the two surfaces. On an atomic sized scale, however, this is not true. When the distance between two surfaces is small enough, there is a finite probability that an electron will jump from the one surface to the other of lower potential.

Experiments have proven this to be true. An experimenter can determine a certain current that he wants the scanning tunneling microscope to maintain. Since the potential barrier is a function of distance between the two surfaces, so is the current. A controller computer can thus measure the current flow between a metal tip and a sample which are very close together. If the current increases, the controller computer can move the tip farther away from the sample, thus increasing the potential barrier, decreasing the probability of an electron jumping from the tip to the sample, and thus decreasing the current. If the current is too low, the computer will do just the opposite, moving the tip closer to the sample, decreasing the potential barrier and increasing the current. By keeping track of the movements of the tip, a realistic picture of the electron density of a surface can be created.

By tunneling current out of a single atom on the tip, the sensitivity of the instrument can be such that single atom layers on a surface can be measured. The STM can resolve local electronic structure at an atomic scale on every kind of conducting solid surface.

A probe tip typically made out of tungsten is attached to a piezodrive, which is a system of very sensitive piezo crystals which will expand or contract in reaction to an applied voltage. By using the piezo to position the tip within a few angstroms of the sample, the electron wavefunctions in the tip and the sample overlap, leading to a tunneling current flow when a bias voltage is applied between the tip and the sample. The tunneling current is amplified and fed into the computer while processing a negative feedback loop to keep the current constant. The computer, by collecting the z distance data, can display a three dimensional image on-screen. This image will represent the electron density of the sample surface. This electron density plot can then in turn be interpreted as the general arrangement or positioning of atoms on a conductive surface. Because the distance measurements are so minuscule, vibrations from the environment must be minimized. In the case of most labs, the sample is suspended in a magnetic field on springs, while the entire workbench is levitated off the ground by applying 60 psi N2 to each of the four legs of the work bench.

Even with all of these precautions, the STM is a sensitive instrument. One of the major problems with instrument sensitivity is tip size. The ideal tip would funnel down to a single atom tip which would be the source of tunneling. Tips, however, are seldom so perfect. Instead, researchers must tease and adapt the tip in a variety of ways to ensure that only one atom will tunnel. This can be done by smashing the tip into the sample to rearrange the atoms on the tip, by heating the tip, by applying high voltage differences between the tip and sample to draw the atoms down the tip, etc.

Referring still to FIG. 1, the functional test (block 102) can be implemented by using the following tests:(a) displacement measurement, (b) deflection measurements, (c) current or resistance measurement, (d) or different types of imaging (fully described above) in combination with tests {(a) displacement measurement, (b) deflection measurements, or (c) current or resistance measurement}. For instance, infrared imaging can be used for global identification followed by SEM or by ion beam imaging for localization with higher spatial resolution. Another important factor in detection is whether it is done on the fabricated wafer before separation of devices into individual components, array of devices, etc. or after separation. When detection is done on all devices before separation, all devices are excited at the same time or devices are excited block by block, say row by row or individually. Provisions have to be made in design and masks, in order to conveniently connect devices to the excitation source when tests are done on the fill wafer before separation of devices.

Referring still to FIG. 1, after at least one MEMS defect is detected, the method of the present invention includes the step (107) of repair each such defect if possible.

In one embodiment of the present invention, the step of performing repair of each detected defect further includes process of physical direct bombardment of the area inside the MEMS device by a focused beam of energy in order to heat and remove the detected defect. The focused beam of energy is selected from the group consisting of: {an ion beam, an electron beam, a coherent light (laser) beam, and a non-coherent light beam}.

Figure 8:
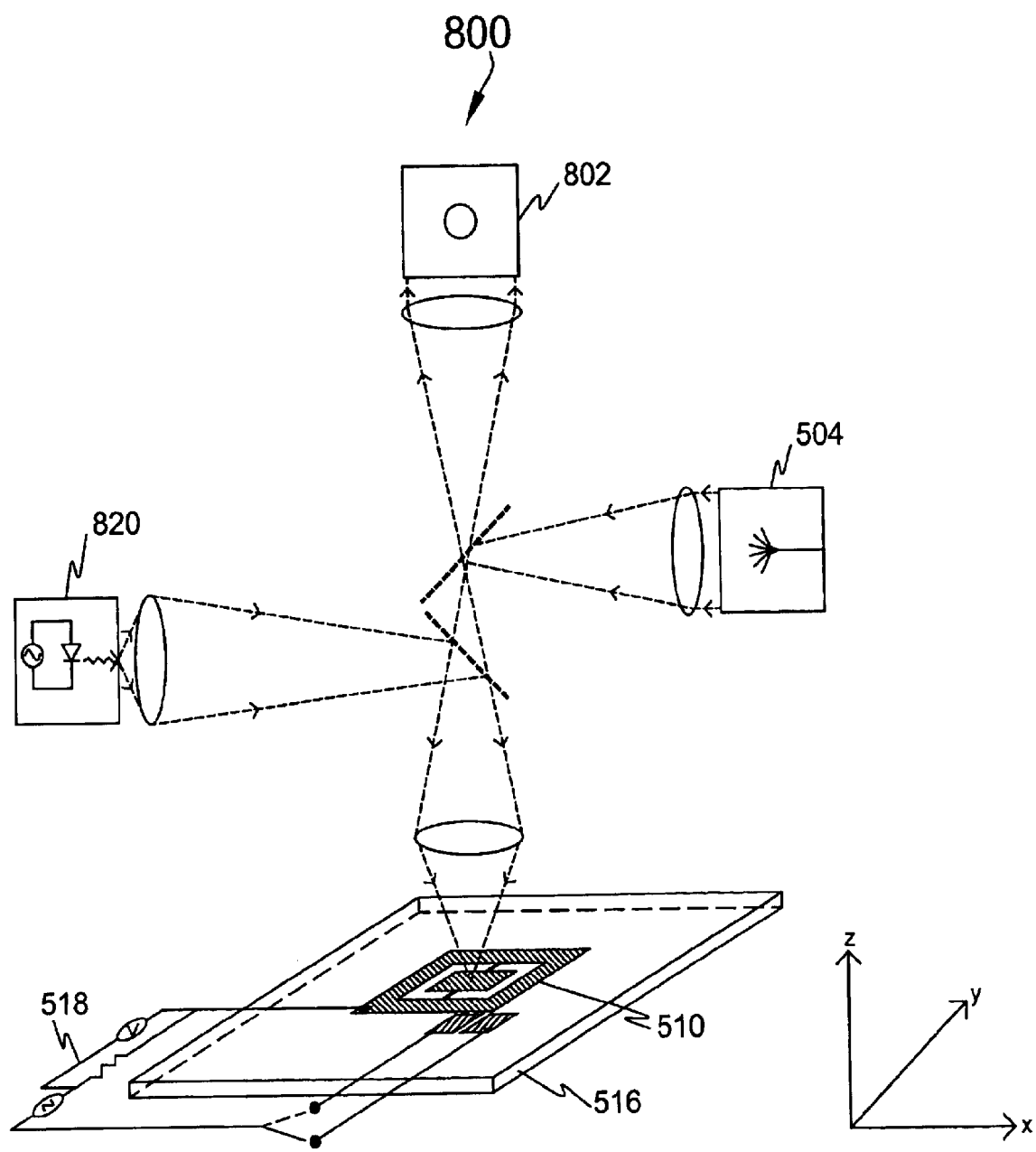
FIG. 8 depicts a apparatus that is used to repair each detected electrical 'short' defect by using a focused laser beam generated by a repair laser.

In one embodiment of the present invention, FIG. 8 illustrates the apparatus 800 that is used to repair each detected defect by using a focused laser beam generated by a repair laser 820. In this embodiment, each defect was previously detected by using one of the methods of detection described above.

The detected defects that can be repaired by using the apparatus 800 include: mechanical defects, electrical 'short' defects, electrical 'open' defects. An 'open' electrical defect disrupts at least one electrical field line, surface or volume that is supposed to be connected, whereas a 'short' electrical defect connects at least two electrical field lines, surfaces or volumes that are supposed to be disconnected.

Figure 9:
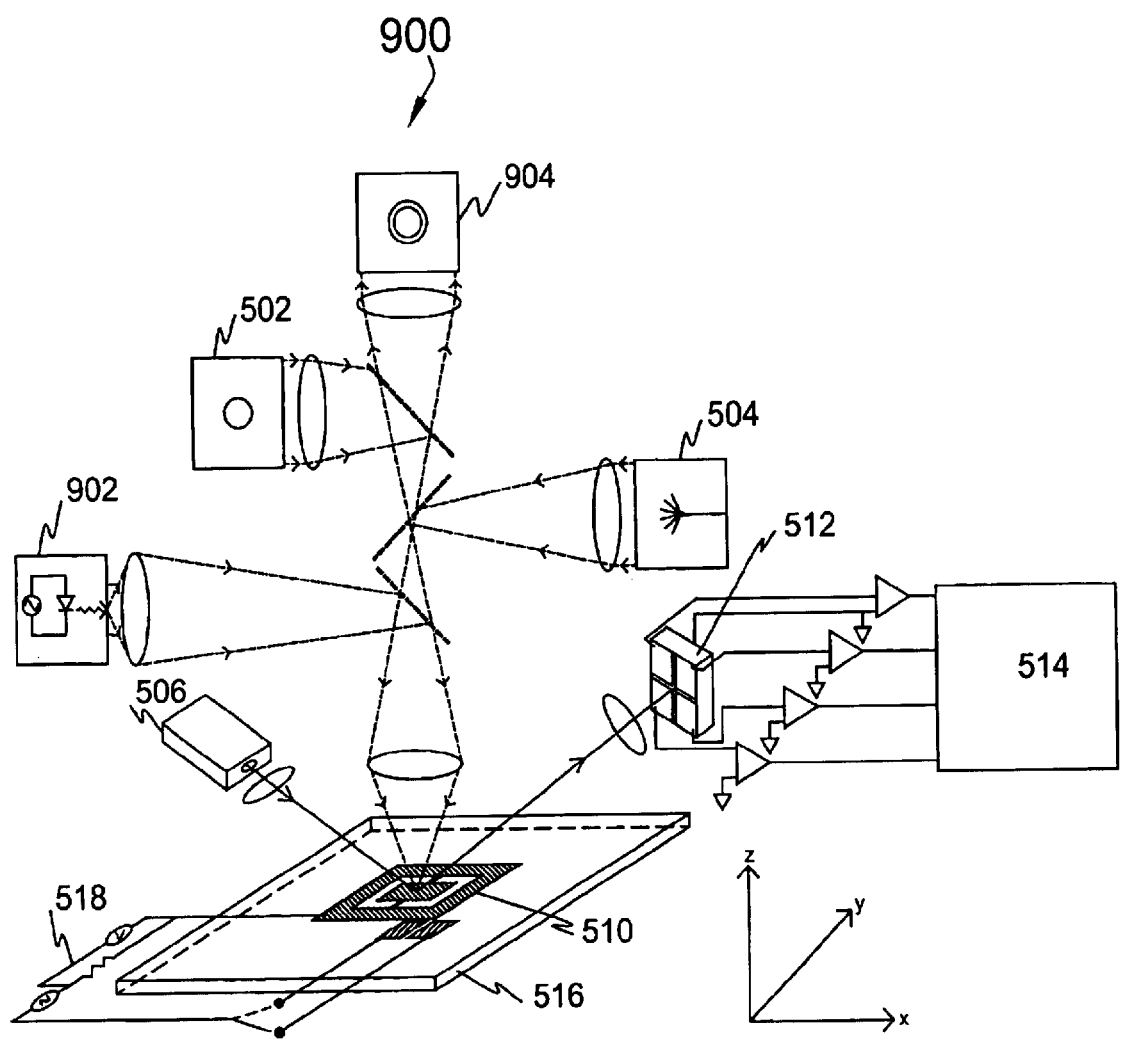
FIG. 9 illustrates an apparatus that is used for thermal detection, position sensing detection, and repair of detected defects.

In one embodiment of the present invention, FIG. 9 illustrates an apparatus 900 that is used for thermal detection, position sensing detection, and repair of detected defects. In this embodiment, the apparatus 900 performs both detection and repair of detected defects. The thermal imaging camera 904 can used for thermal detection of a 'short' electrical defect that manifests itself as an area with a higher local temperature than temperature of the surrounding area, as well as an 'open' electrical defect that manifests itself as an area with a lower local temperature than temperature of the surrounding area. The repair laser 902 supplies the focused beam of energy that is used to heat and remove the detected electrical 'short' defect, or the detected electrical 'open' defect.

Figure 10:
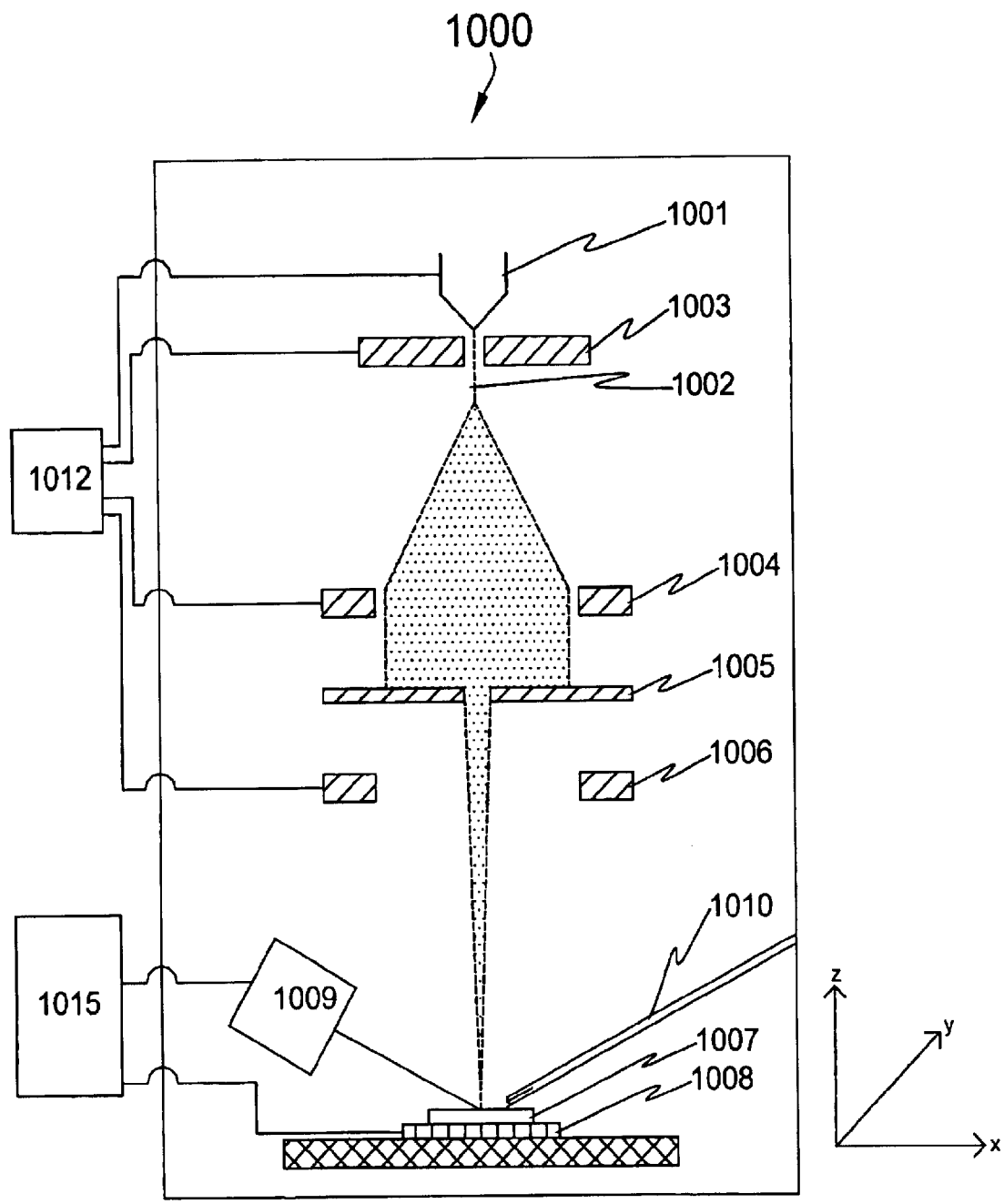
FIG. 10 shows an apparatus that is used for focused ion beam detection and repair of detected defects.

In one embodiment of the present invention, FIG. 10 illustrates an apparatus 1000 that is used for focused ion beam detection and repair of detected defects. In this embodiment, the apparatus 1000 performs both detection and repair of detected defects. The focused ion beam (FIB) gun (1001–1002–1003) is used for ion beam detection of all kind of defects, including mechanical defects, 'short' electrical defects, and 'open' electrical defects. See full discussion above. The ion beam gun 1001–1002–1003 also is used for repair process because it supplies the focused beam of energy that is used to heat and remove each detected defect.

In one embodiment of the present invention, FIG. 10 illustrates an apparatus 1000 that is used for defect detection by using the ion beam gun (1001–1002–1003) and for repair of detected defects by using a process of chemical reaction in the presence of a reactive gas that is suppled by the gas inlet 1010.

If the detected defect is an electrical 'short' defect, the process of repair includes the following steps: (1) using a process of physical direct bombardment of the area inside the MEMS device wherein the at least one electrical 'short' defect was detected by a focused beam of energy, and (2) using a process of chemical reaction in the presence of a reactive gas to repair each electrical 'short' defect. The reactive gas reacts with the material of the MEMS in the presence of the focused beam of energy that provides the energy necessary for the chemical reaction to occur.

If ion beams are used to remove material from the surface of the sample, such process is called milling. It is a major advantage of FIB as much of the constructional analysis and failure analysis of semi-conductor devices is performed on cross-sections. In a typical cross-sectional analysis, a crater is milled in the sample and the imaging is performed on the originally vertical wall of the crater after tilting the sample—generally by 45 degrees. These craters are usually 15–20 nanometer wide and are milled in several steps. The initial crater has a stair case shape and is created using a strong beam current. The final milling of the wall is accomplished using line scans with a low beam current, so that the face obtained is flat and steep. As with any analytical technique, FIB analysis also has its drawbacks. Major problems include damage to the milled surfaces from ion implantation, and the fact that some milling will occur during the imaging process. This milling slowly degrades the quality of the images. The latter problem can be avoided by using dual-beam FIB systems. These combine a FIB and an SEM column where the ion beam can be used for milling and the electron beam for imaging.

Ion beam milling can be also performed with the assistance of small quantities of gas. These gases are introduced via gas needles that are positioned near the area being milled—usually about 100 micrometer out of the field of view and 100 micrometer above the sample surface. Gas assisted ion milling offers several advantages, including selective milling of certain types of materials such as metals, insulators or carbon-based compounds. A gas can be used to increase etching rates and to minimize the redeposition of the milled material in the region surrounding the crater. During the gas-assisted process, gas is adsorbed onto the surface, where it reacts with the ion beam and the surface material, producing volatile compounds that are pumped away. Halogen gases such as iodine, chlorine, bromine and iodine chloride are used to enhance aluminum etching. Xenon fluoride is used for the etching of insulators and semiconductors such as silicon, and water vapor for the milling of carbon-based materials.

If the detected defect is an electrical 'open' defect, the process of repair includes the following steps: (1) using a focused beam of energy to supply energy to each electrical 'open' defect; and (2) depositing material to each electrical 'open' defect by using a photochemical reaction in the presence of a reactive gas between the gas and the material of the MEMS, wherein the electrical 'open' defect is eliminated when covered by the deposited material.

The repair-deposition is a similar process to gas-assisted milling. FIB can be used to deposit metals such as platinum and tungsten, and silicon oxide insulators. In these applications, the beam parameters and gas flow are optimized for the most efficient equilibrium between the cracking of the precursor gases and the milling action of the beam. If the current density is too large, gas adsorption at the surface is inhibited and the milling process dominates. Conversely, if the current density is too low, each pass of the scanning beam will not crack all the adsorbed molecules.

In one embodiment of the present invention (not shown), if at least one detected defect is an electrical 'short' defect, the step of performing repair of each electrical 'short': defect further includes the step of using an atomic force tip (see discussion above) and a process of physical or proximity wear of the area in the MEMS device wherein the at least one electrical 'short' defect was detected to remove an undesirable material.

In one embodiment of the present invention (not shown), if at least one detected defect is an electrical 'open' defect, the step of performing repair of each electrical 'open' defect further includes the step of using an atomic force instrument (see discussion above) to deposit material to each electrical 'open' defect by using a process of direct material transfer, wherein the electrical 'open' defect is eliminated when covered by the deposited material.

In one embodiment of the present invention (not shown), if at least one detected defect is a physical obstruction defect; wherein the physical obstruction defect (POD) interferes with operation of MEMS device, the step of performing repair of each POD defect further includes (a) the step of using a focused beam of energy selected from the group consisting of {an ion beam, an electron beam, a coherent light (laser) beam, and a non-coherent light beam} to eliminate the POD physical defect.

In one embodiment of the present invention (not shown), a high power light source is used to ablate the defect by physically ablating the material. For example, the Neodymium YAG laser can be used with wavelength 1064 nm; or 532 nm; or 356 nm.

In one embodiment of the present invention (not shown), if at least one detected defect is a physical obstruction defect; wherein the physical obstruction defect (POD) interferes with operation of MEMS device, the step of performing repair of each POD defect further includes the step of using one of the techniques selected from the group consisting of {an atomic force microscopy, and a scanning tunneling microscopy} to eliminate the POD physical defect.

In one embodiment of the present invention (not shown), if at least one detected defect is a physical obstruction defect, or an 'open' electrical defect, or a 'short' electrical defect, the step of performing repair of each detected defect further includes the step of using a robotic means to repair each defect.

However, the usage of micro and miniature robots to repair MEMS defects offers a variety of technical challenges. Chief among these are mechanisms of locomotion for low-mass devices, integration of low-power electronic control and payloads, energy sources and human robot control. The enabling robot technology includes: a. Locomotion mechanisms that allow movement over a variety of surfaces and in a variety of terrain; b. Designs and mechanisms that incorporate multiple forms of locations to accommodate movement over a variety of surfaces and in a variety of terrain; c. Designs and mechanisms that can automatically reconfigure themselves, from tens to hundreds of individual components, to accommodate various surfaces and terrain, or to adapt to different missions; d. On-board electronic systems for sensing, navigation, communication and processing; e. Designs that combine structure and function; f. New methods for achieving multiple use by incorporation of individual robot capabilities/intelligence and pooled or layered capabilities; and g. Human interfaces and robot control functions.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. Therefore, it is intended that the scope of the invention be defined by the claims appended hereto and their equivalents, rather than by the foregoing description. All changes which come within the meaning and range of equivalency of the claims are to be embraced within their scope.

What is claimed is:

1. A method of defect detection and repair of micro-electro-mechanical systems (MEMS) devices comprising the steps of:

(A) detecting at least one defect in said MEMS device, wherein each said defect is an object that prevents said MEMS device from functioning substantially properly;

(B) performing repair of each said detected defect;

(C) checking whether said MEMS device is functioning substantially properly after each said detected defect is repaired; and (D) if said MEMS device is not functioning substantially properly after each said detected defect is repaired, repeating said steps (A–C).

2. The method of claim 1, wherein said step (A) of performing detection of each said defect further includes the step of:

(A2) performing 2-D mapping of a non-uniform distribution of the local temperature on the surface of said MEMS device.

3. The method of claim 2, wherein said step (A2) of performing 2-D mapping of said non-uniform distribution of the local temperature on the surface of said MEMS device further includes the step of:

applying excitation to said MEMS device.

4. The method of claim 2, wherein said step (A2) of performing 2-D mapping of said non-uniform distribution of the local temperature on the surface of said MEMS device further includes the step of:

applying electromagnetic energy to said MEMS device.

5. The method of claim 2, wherein said step (A2) of performing 2-D mapping of said non-uniform distribution of the local temperature on the surface of said MEMS device further includes the step of:

applying electrical energy to said MEMS device at a constant current level, at a constant power level, or at a constant voltage level.

6. The method of claim 1;

wherein said step (A) of detecting at least one defect in said MEMS device further includes the step of:

detecting at least one electrical 'short' defect, wherein each said electrical 'short' defect connects at least two electrical field lines, surfaces or volumes that are supposed to be disconnected, and wherein each said electrical 'short' defect manifests itself as an area with a higher local temperature than temperature of the surrounding area;

and wherein said step (B) of performing repair of each said electrical 'short' defect further includes the step of:

using a process of physical direct bombardment of the area inside said MEMS device wherein said at least one electrical 'short' defect was detected by a focused beam of energy in order to heat and remove said defect, wherein said focused beam of energy is selected from the group consisting of: {an ion beam, an electron beam, a coherent light (laser) beam, and a non-coherent light beam}.

7. The method of claim 1;

wherein said step (A) of detecting at least one defect in said MEMS device further includes the step of:

detecting at least one electrical 'short' defect;

and wherein said step (B) of performing repair of each said electrical 'short' defect further includes the steps of:

using a process of physical direct bombardment of the area inside said MEMS device wherein said at least one electrical 'short' defect was detected by a focused beam of energy; and using a process of chemical reaction in the presence of a reactive gas to repair each said electrical 'short' defect, wherein said reactive gas reacts with the material of said MEMS in the presence of said focused beam of energy that provides the energy necessary for said chemical reaction to occur;

wherein said focused beam of energy is selected from the group consisting of: {an ion beam, an electron beam, a coherent light (laser) beam, and a non-coherent light beam}.

8. The method of claim 1;

wherein said step (A) of detecting at least one defect in said MEMS device further includes the step of:
detecting at least one electrical 'short' defect;

and wherein said step (B) of performing repair of each said electrical 'short' defect further includes the step of:
using an atomic force tip and a process of physical or proximity wear of the area in said MEMS device wherein said at least one electrical 'short' defect was detected to remove an undesirable material.

9. The method of claim 1;

wherein said step (A) of detecting at least one defect in said MEMS device further includes the step of:
detecting at least one electrical 'open' defect, wherein said electrical 'open' defect disrupts at least one electrical field line, surface or volume that is supposed to be connected, and wherein each said electrical 'open' defect manifests itself as an area with a lower local temperature than the temperature of the surrounding area;

and wherein said step (B) of performing repair of each said electrical 'open' defect further includes the steps of:
using a focused beam of energy to supply energy to each said electrical 'open' defect; and
depositing material to each said electrical 'open' defect by using a photochemical reaction in the presence of a reactive gas between said gas and the material of said MEMS, wherein said electrical 'open' defect is eliminated when covered by said deposited material;

wherein said focused beam of energy is selected from the group consisting of: {an ion beam, an electron beam, a coherent light (laser) beam, and a non-coherent light beam}.

10. The method of claim 1;

wherein said step (A) of detecting at least one defect in said MEMS device further includes the step of:
detecting at least one electrical 'open' defect, wherein said electrical 'open' defect disrupts at least one electrical field line, surface or volume that is supposed to be connected and wherein said step (B) of performing repair of each said electrical 'open' defect further includes the step of:
using an atomic force instrument to deposit material to each said electrical 'open' defect by using a process of direct material transfer, wherein said electrical 'open' defect is eliminated when covered by said deposited material.

11. The method of claim 1;

wherein said step (A) of detecting at least one defect in said MEMS device further includes the step of:
detecting a physical obstruction defect; wherein said physical obstruction defect (POD) interferes with operation of MEMS device;

and wherein said step (B) of performing repair of each said POD defect further includes the step of:
using a focused beam of energy selected from the group consisting of {an ion beam, an electron beam, a coherent light (laser) beam, and a non-coherent light beam} to eliminate said POD physical defect.

12. The method of claim 1;

wherein said step (A) of detecting at least one defect in said MEMS device further includes the step of:
detecting a physical obstruction defect; wherein said physical obstruction defect (POD) interferes with operation of MEMS device;

and wherein said step (B) of performing repair of each said POD defect further includes the step of:
using one of the techniques selected from the group consisting of {an atomic force microscopy, and a scanning tunneling microscopy} to eliminate said POD physical defect.

13. The method of claim 1; wherein said step (B) of performing repair of each said detected defect further includes the step of:
using a robotic means to repair each said detected defect.

* * * * *